(12) United States Patent
Cai et al.

(10) Patent No.: US 10,411,044 B2
(45) Date of Patent: Sep. 10, 2019

(54) DISPLAY SUBSTRATE AND MANUFACTURING METHOD THEREOF, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhenfei Cai, Beijing (CN); Wenjie Wang, Beijing (CN); Jing Hao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 5 days.

(21) Appl. No.: 15/532,470

(22) PCT Filed: Sep. 20, 2016

(86) PCT No.: PCT/CN2016/099429
§ 371 (c)(1),
(2) Date: Jun. 1, 2017

(87) PCT Pub. No.: WO2017/118096
PCT Pub. Date: Jul. 13, 2017

(65) Prior Publication Data
US 2018/0047760 A1    Feb. 15, 2018

(30) Foreign Application Priority Data
Jan. 7, 2016 (CN) .................... 2016 2 0023460 U

(51) Int. Cl.
*H01L 27/12* (2006.01)
*G02F 1/1362* (2006.01)
(Continued)

(52) U.S. Cl.
CPC ........ *H01L 27/1244* (2013.01); *G02F 1/1362* (2013.01); *G02F 1/133345* (2013.01);
(Continued)

(58) Field of Classification Search
CPC ............. H01L 27/1244; H01L 27/1248; H01L 29/786; H01L 27/1296; G02F 1/136286;
(Continued)

(56) References Cited

U.S. PATENT DOCUMENTS 6,011,274 A * 1/2000 Gu ........................ G02F 1/1368
257/258
2001/0019384 A1* 9/2001 Murade ............. G02F 1/133512
349/110
(Continued)

FOREIGN PATENT DOCUMENTS

CN       101577248 A    11/2009
CN       102023430 A    4/2011
(Continued)

OTHER PUBLICATIONS

International Search Report and Written Opinion in PCT/CN2016/099429 dated Dec. 19, 2016, with English translation.

*Primary Examiner* — Charles D Garber
*Assistant Examiner* — S M Sohel Imtiaz
(74) *Attorney, Agent, or Firm* — Womble Bond Dickinson (US) LLP

(57) ABSTRACT

The present disclosure relates to a display substrate comprising a substrate; a data line disposed over the substrate; a first insulating layer disposed on the data line; a second insulating layer disposed on the first insulating layer; a first
(Continued)

transparent electrode disposed on the second insulating layer. The present disclosure further relates to a manufacturing method of a display substrate and a display device.

15 Claims, 4 Drawing Sheets

(51) Int. Cl.
    *G02F 1/1343*     (2006.01)
    *H01L 29/786*     (2006.01)
    *G02F 1/1333*     (2006.01)

(52) U.S. Cl.
    CPC .. *G02F 1/134309* (2013.01); *G02F 1/136286* (2013.01); *H01L 27/1248* (2013.01); *H01L 27/1296* (2013.01); *H01L 29/786* (2013.01); *G02F 2001/134372* (2013.01); *G02F 2201/40* (2013.01); *G02F 2201/50* (2013.01)

(58) Field of Classification Search
    CPC ............. G02F 1/1362; G02F 1/134309; G02F 2201/40
    See application file for complete search history.

(56) References Cited

U.S. PATENT DOCUMENTS

| | | | |
|---|---|---|---|
| 2003/0057419 A1* | 3/2003 | Murakami | G02F 1/13454 257/72 |
| 2004/0263754 A1 | 12/2004 | Ahn et al. | |
| 2009/0109386 A1* | 4/2009 | Chen | G02F 1/133707 349/123 |
| 2009/0251628 A1* | 10/2009 | Lin | G02F 1/13439 349/39 |
| 2012/0154705 A1* | 6/2012 | Ahn | G02F 1/136213 349/46 |
| 2013/0270562 A1* | 10/2013 | Yamazaki | H01L 29/786 257/57 |
| 2014/0054703 A1* | 2/2014 | Feng | G02F 1/134363 257/347 |
| 2016/0111442 A1* | 4/2016 | Wu | H01L 27/124 257/72 |
| 2017/0038650 A1* | 2/2017 | Nakanishi | G02F 1/1343 |

FOREIGN PATENT DOCUMENTS

| | | |
|---|---|---|
| CN | 103208491 A | 7/2013 |
| CN | 105068340 A | 11/2015 |
| CN | 205384420 U | 7/2016 |

\* cited by examiner

DISPLAY SUBSTRATE AND MANUFACTURING METHOD THEREOF, DISPLAY DEVICE

RELATED APPLICATION

The present application is the U.S. national phase entry of PCT/CN2016/099429, with an international filing date of Sep. 20, 2016, which claims the benefit of Chinese Patent Application No. 201620023460.0, filed on Jan. 7, 2016, the entire disclosure of which is incorporated herein by reference.

FIELD

The present disclosure relates to the field of display technology, and particularly to a display substrate, a display device, and a manufacturing method of a display substrate.

BACKGROUND

During a production process of the current TFT-LCD production line, due to the large space of the apparatus chamber, there may exist many foreign matters such as particles, which are easily deposited on a substrate together with reaction gases.

SUMMARY

The present disclosure proposes a display substrate comprising a substrate; a data line disposed over the substrate; a first insulating layer disposed on the data line; one or more second insulating layers disposed on the first insulating layer; a first transparent electrode disposed on the one or more second insulating layers.

In some embodiments, the display substrate further comprises a gate and a second transparent electrode disposed on the substrate, the second transparent electrode being corresponding to the first transparent electrode; one or more third insulating layers disposed on the gate and the second transparent electrode. The data line is disposed on the one or more third insulating layers.

In some embodiments, the first insulating layer, the one or more second insulating layers, and the one or more third insulating layers are made of at least one of: a silicon-nitrogen compound, a silicon-oxygen compound.

In some embodiments, the display substrate further comprises an active layer disposed on the one or more third insulating layers; a source and a drain disposed on the active layer. The first insulating layer, the one or more second insulating layers, and the one or more third insulating layers are provided with a first via hole for communicating the second transparent electrode with the drain. A first connection layer is provided in the first via hole for electrically connecting the second transparent electrode to the drain.

In some embodiments, a portion of an upper surface of the drain is exposed in the first via hole, and the first connection layer is in contact with a side surface of the drain and the exposed portion of the upper surface thereof, and a side surface of the second transparent electrode.

In some embodiments, the display substrate further comprises a first transparent electrode line disposed on the substrate. The first insulating layer, the one or more second insulating layers, and the one or more third insulating layers are provided with a second via hole at positions corresponding to the first transparent electrode line. The display substrate further comprises a second connection layer that is provided in the second via hole for electrically connecting the first transparent electrode line to the first transparent electrode.

In some embodiments, a portion of the first connection layer, a portion of the second connection layer and the first transparent electrode are disposed in a same layer.

In some embodiments, the first transparent electrode line, the second transparent electrode, and the gate are disposed in a same layer.

In some embodiments, the data line, the source and the drain are disposed in a same layer.

In some embodiments, the first transparent electrode is a common electrode, and the second transparent electrode is a pixel electrode.

The present disclosure further proposes a display device comprising the display substrate described above.

The present disclosure further provides a manufacturing method of a display substrate. The method comprises: forming a gate and a second transparent electrode on a substrate; forming a third insulating layer on the gate and the second transparent electrode; forming an active layer on the third insulating layer and forming a source, a drain, and a data line on the active layer; forming a first insulating layer on the source, the drain and the data line; forming a second insulating layer on the first insulating layer; and forming a first transparent electrode on the second insulating layer.

In some embodiments, the manufacturing method described above further comprises: forming, prior to forming the first transparent electrode, a first via hole in the first insulating layer, the second insulating layer and the third insulating layer for communicating the second transparent electrode with the drain, and forming a first connection layer in the first via hole to electrically connect the second transparent electrode to the drain.

In some embodiments, the step of forming the gate and the second transparent electrode on the substrate further comprises forming a first transparent electrode line on the substrate.

In some embodiments, the step of forming a first via hole in the first insulating layer, the second insulating layer and the third insulating layer for communicating the second transparent electrode with the drain further comprises forming a second via hole in the first insulating layer, the second insulating layer and the third insulating layer at positions corresponding to the first transparent electrode line, and forming a second connection layer in the second via hole to electrically connect the first transparent electrode line to the first transparent electrode.

In some embodiments, the first via hole is formed by dry etching.

According to the above technical solution, by disposing a first insulating layer and one or more second insulating layers, the data line can be spaced apart from the first transparent electrode by multiple insulating layers, and the data line would not be in conduction with the first transparent electrode in the event that conductive particles are present in one of the insulating layers. By disposing the second transparent electrode on the substrate, the first transparent electrode is spaced apart from the second transparent electrode at least by three insulating layers, and the first transparent electrode would not be in conduction with the second transparent electrode in the event that conductive particles are present in one or two of the insulating layers. Therefore, the technical solution of the present disclosure reduces the short circuit between the data line and the first transparent electrode layer, and between the first transparent electrode layer and the second transparent electrode layer.

BRIEF DESCRIPTION OF DRAWINGS

The features and advantages of the present disclosure will be understood more clearly with reference to the accompanying drawings which are schematic and should not be construed as limiting the present disclosure. In the drawings.

DETAILED DESCRIPTION OF THE INVENTION

Figure 1:
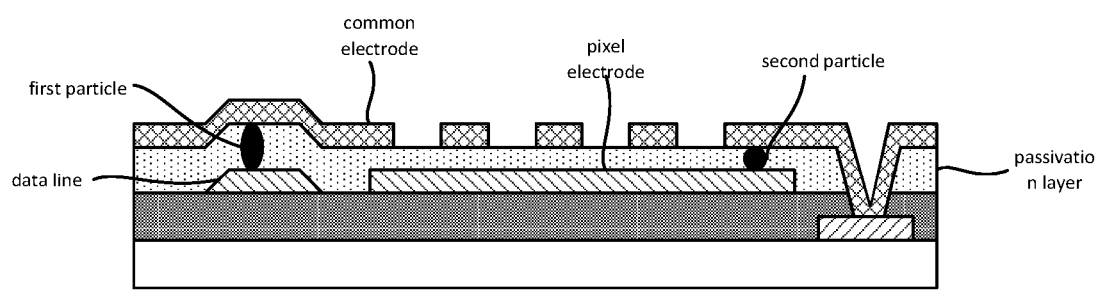
FIG. 1 illustrates a schematic view of a typical structure of a display substrate.

The present disclosure will be described in further detail below with reference to the accompanying drawings and specific example implementations in order to provide a clearer understanding of the above objectives, features and advantages of the present disclosure. It is to be noted that the embodiments of the present application and the features therein may be combined with each other without conflict.

Numerous specific details are set forth in the description below so that the present disclosure can be fully understood. However, the present disclosure may be further implemented in other manners different from those described herein, and therefore, the scope of the present disclosure is not limited to the specific embodiments disclosed below.

In the drawings, the following reference numerals are used:

1—substrate; 2—data line; 3—first insulating layer; 4—second insulating layer; 5—first transparent electrode; 6—gate; 7—second transparent electrode; 8—third insulating layer; 9—active layer; 10—source; 11—drain; 12—first via hole; 13—first connection layer; 14—first transparent electrode line; 15—second via hole; 16—second connection layer; 17—conductive particle.

In a typical production process of a TFT-LCD of an advanced super dimension switch (ADS) or high aperture ratio ADS (HADS) type, as shown in FIG. 1, upon formation of a passivation layer, the first particle in the passivation layer which is located on a data line may short-circuit the data line and a common electrode, forming poor signal transmission, and the second particle that falls within the pixel region may short-circuit a pixel electrode and the common electrode, forming bad points. At present, the incidence of these two deficiencies is very high, and they cannot be effectively resolved by measures such as cleaning the apparatus.

Figure 2:
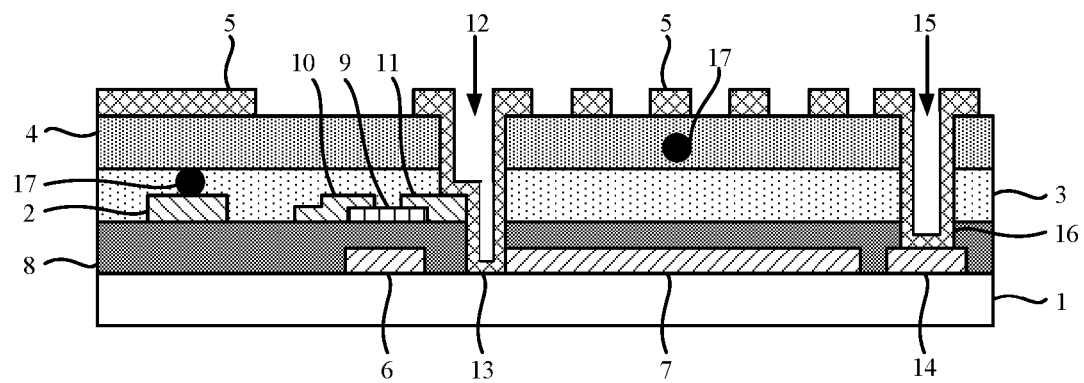
FIG. 2 illustrates a schematic view of the structure of a display substrate according to embodiments of the present disclosure.

FIG. 2 illustrates a schematic view of a display substrate according to embodiments of the present disclosure. As shown in FIG. 2, the display substrate comprises a substrate 1; a data line 2 disposed over the substrate 1; a first insulating layer 3 disposed on the data line 2; a second insulating layer 4 disposed on the first insulating layer 3; and a first transparent electrode 5 disposed on the second insulating layer 4. By disposing the first insulating layer 3 and the second insulating layer 4, the data line 2 can be spaced apart from the first transparent electrode 5 (e.g. common electrode) by a plurality of insulating layers, and the data line 2 would not be in conduction with the first transparent electrode 5 in the event that conductive particles 17 are present in one of the insulating layers (e.g. first insulating layer 3). Even if conductive particles are present in multiple insulating layers, the probability that the conductive particles in the multiple insulating layers are connected is also extremely small, so that the probability of the conduction of the data line 2 with the first transparent electrode 5 is extremely small, thereby ensuring that the data line 2 would not electrically communicate with the first transparent electrode 5 due to the conductive particles in the insulating layers to cause a short circuit.

In some embodiments, as shown in FIG. 2, the display substrate further comprises a gate 6 and a second transparent electrode 7 disposed on the substrate 1, the second transparent electrode 7 being corresponding to the first transparent electrode 5, and a third insulating layer 8 disposed on the gate 6 and the second transparent electrode 7, wherein the data line 2 is disposed on the third insulating layer 8. In such embodiments, by disposing the second transparent electrode 7 on the substrate 1, the first transparent electrode 5 is spaced apart from the second transparent electrode 7 (e.g. pixel electrode) at least by three insulating layers (which are the first insulating layer 3, the second insulating layer 4, and the third insulating layer 8 respectively in FIG. 2), and the first transparent electrode 5 would not be in conduction with the second transparent electrode 7 in the event that conductive particles are present in one or two insulating layers. Even if conductive particles are present in the at least three insulating layers, the probability that the conductive particles in the at least three insulating layers are connected is also extremely small, so that the probability of the conduction of the first transparent electrode 5 with the second transparent electrode 7 is extremely small, thereby ensuring that the first transparent electrode 5 would not electrically communicate with and the second transparent electrode 7 due to the conductive particles in the insulating layers to cause a short circuit.

The first insulating layer 3, the second insulating layer 4 and the third insulating layer 8 are made of at least one of the following materials: a silicon-nitrogen compound, a silicon-oxygen compound. The silicon-nitrogen compound (e.g. silicon nitride) and the silicon-oxygen compound (e.g. silicon oxide) are both materials commonly used in the art for the insulating layer, the manufacturing process of which is relatively mature and easy to set.

In some embodiments, as shown in FIG. 2, the display substrate further comprises an active layer 9 disposed on the third insulating layer 8, and a source 10 and a drain 11 disposed on the active layer 9. The first insulating layer 3, the second insulating layer 4 and the third insulating layer 8 are provided with a first via hole 12 for communicating the second transparent electrode 7 with the drain 11, and the first via hole 12 is provided with a first connection layer 13 for electrically connecting the second transparent electrode 7 to the drain 11.

The drain 11 and the second transparent electrode 7 can be electrically connected by the first via hole 12 and the first connection layer 13 so as to ensure that, when the thin film transistor is turned on, data signals can be transmitted from the data line 2 to the source 10, and transmitted from the source 10 to the drain 11 and further to the second transparent electrode 7.

A portion of the upper surface of the drain 11 can be exposed in the first via hole 12 so that the first connection layer 13 is in contact with a side surface and the exposed portion of the upper surface of the drain 11 and a side surface of the second transparent electrode 7.

The first via hole 12 may be formed by dry etching. Since the first insulating layer 3, the second insulating layer 4 and the third insulating layer 8 made of a semiconductor material are etched by drying etching at a faster speed, while the drain 11 made of a metal material is etched by dry etching at a slower speed, upon formation of the first via hole 12, the via hole formed in the first insulating layer 3 and the second insulating layer 4 may be relatively large, whereas the via hole formed in the third insulating layer 8 is relatively small due to the occlusion of the drain 11, so that a portion of the upper surface of the drain 11 is exposed in the formed first via hole 12.

Since the area of the side surface of the drain is usually small, it is difficult to ensure a good electrical connection between the first connection layer and the drain if the first connection layer is only in contact with the side surface of the drain. In the present embodiment, there may be a certain contact area between the first connection layer 13 and the upper surface of the drain 11 so that the second transparent electrode 7 and the drain 11 have a good electrical connection relationship to ensure that data signals can be well transmitted to the second transparent electrode 7.

In some embodiments, as shown in FIG. 2, the display substrate further comprises a first transparent electrode line 14 disposed on the substrate 1. The first insulating layer 3, the second insulating layer 4 and the third insulating layer 8 are provided with a second via hole 15 at positions corresponding to the first transparent electrode line 14. A second connection layer 16 is provided in the second via hole 15 for electrically connecting the first transparent electrode line 14 to the first transparent electrode 5.

By means of the second via hole 15 and the second connection layer 16, it can be ensured that signals in the first transparent electrode line 14 can be transmitted to the first transparent electrode 5.

As shown in FIG. 2, a portion of the first connection layer 13, a portion of the second connection layer 16 and the first transparent electrode 5 may be disposed in the same layer, thereby simplifying the manufacturing process.

The first transparent electrode line 14, the second transparent electrode 7 and the gate 6 may be disposed in the same layer, thereby simplifying the manufacturing process.

In addition, the data line 2, the source 10 and the drain 11 may be disposed in the same layer, thereby simplifying the manufacturing process.

In some embodiments, the first transparent electrode 5 is a common electrode, and the second transparent electrode 7 is a pixel electrode.

The present disclosure further proposes a display device comprising the above-described display substrate.

It is to be noted that the display device in the present embodiment may be any product or component having display function such as an electronic paper, a mobile phone, a tablet computer, a television set, a notebook computer, a digital photo frame, a navigator, or the like.

Figure 3:
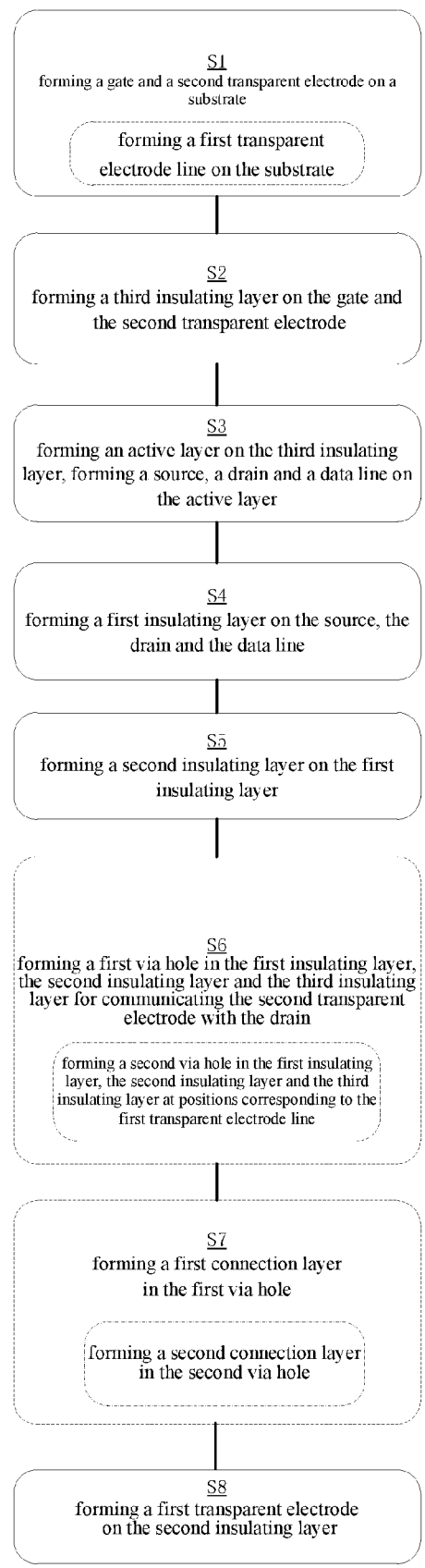
FIG. 3 illustrates a schematic flow chart of a manufacturing method of a display substrate according to embodiments of the present disclosure.
Figure 4:
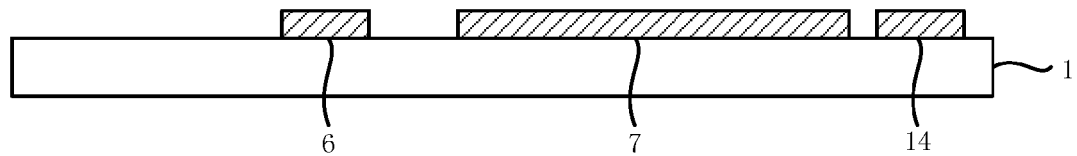
FIGS. 4 to 10 schematically illustrate schematic views of the steps of a manufacturing method of a display substrate according to embodiments of the present disclosure.
Figure 5:
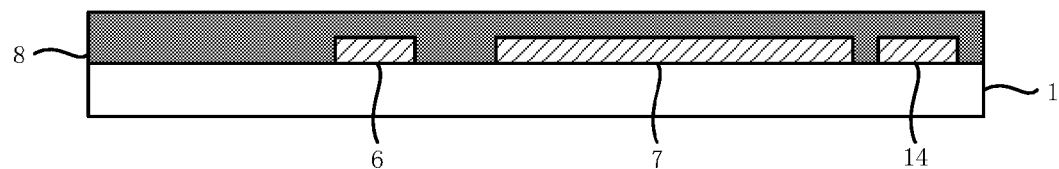
Figure 6:
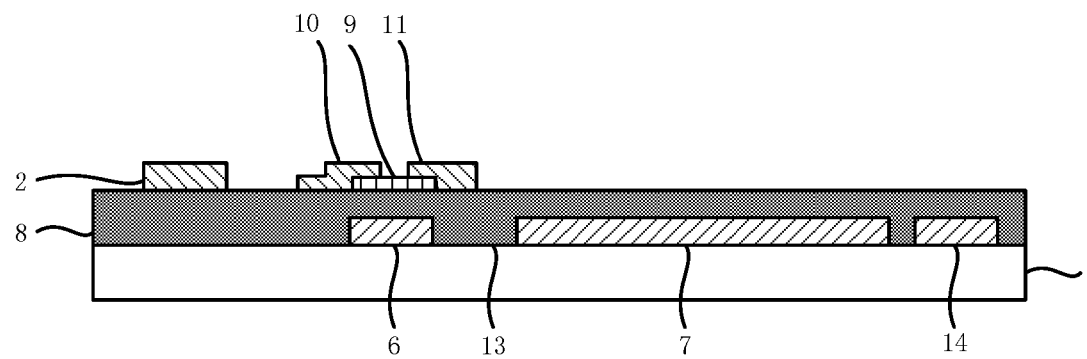
Figure 7:
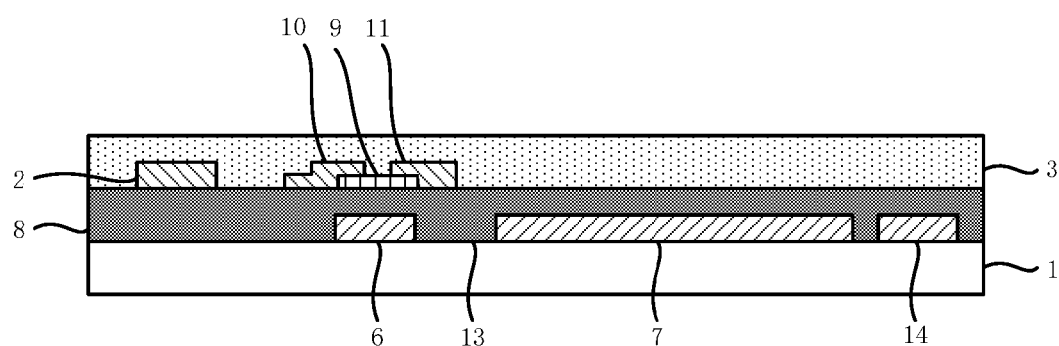
Figure 8:
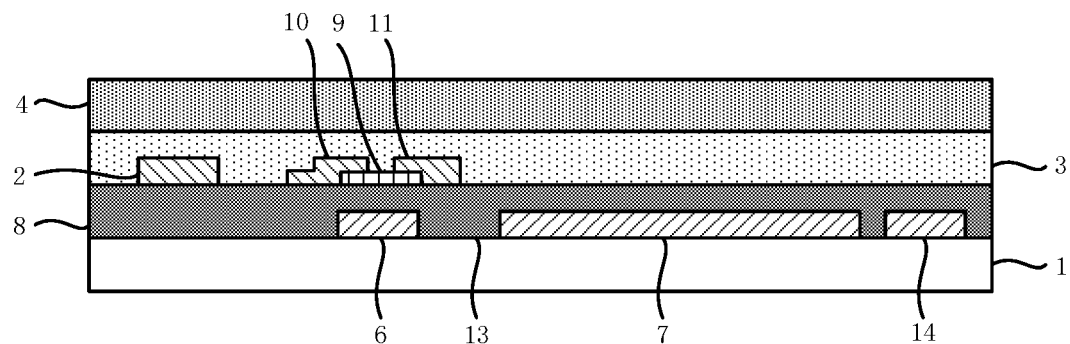
Figure 10:
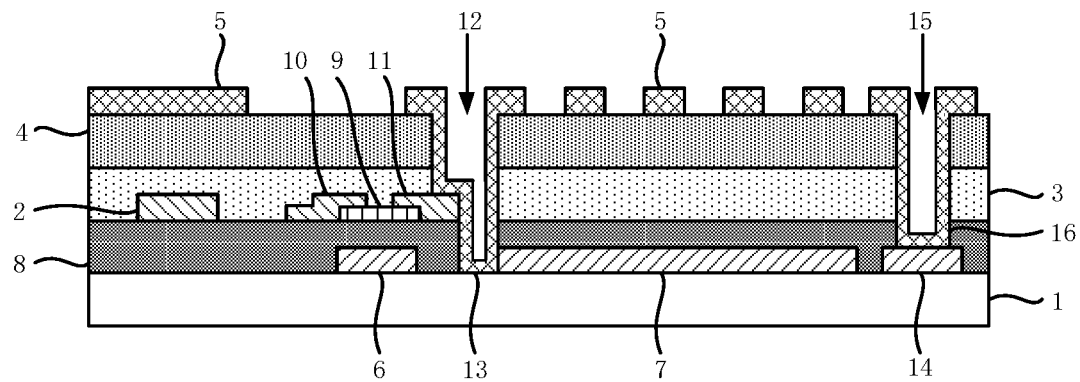

The present disclosure further proposes a method of manufacturing a display substrate. As shown in FIG. 3, the method of manufacturing a display substrate comprises the steps of:

in step S1, forming a gate 6 and a second transparent electrode 7 on a substrate 1, as shown in FIG. 4;

in step S2, forming a third insulating layer 8 on the gate 6 and the second transparent electrode 7, as shown in FIG. 5;

in step S3, forming an active layer 9 on the third insulating layer 8, and forming a source 10, a drain 11 and a data line 2 on the active layer 9, as shown in FIG. 6;

in step S4, forming a first insulating layer 3 on the source 10, the drain 11 and the data line 2, as shown in FIG. 7;

in step S5, forming a second insulating layer 4 on the first insulating layer 3, as shown in FIG. 8;

in step S8, forming a first transparent electrode 5 on the second insulating layer 4, as shown in FIG. 10.

Figure 9:
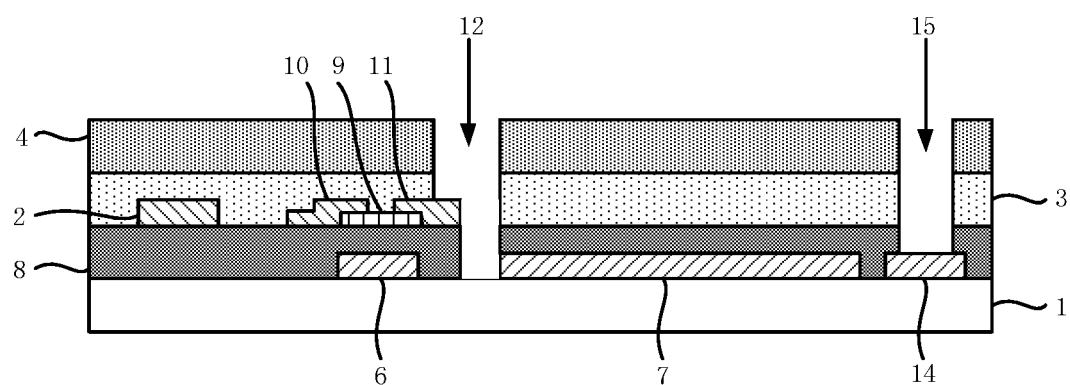

Optionally, the method of manufacturing a display substrate may further comprise, prior to step S8, the steps of:

in step S6, forming a first via hole 12 in the first insulating layer 3, the second insulating layer 4 and the third insulating layer 8 for communicating the second transparent electrode 7 with the drain 11, as shown in FIG. 9;

in step S7, forming a first connection layer 13 in the first via hole 12 to electrically connect the second transparent electrode 7 to the drain 11, as shown in FIG. 10.

Optionally, step S1 further comprises forming a first transparent electrode line 14 on the substrate 1.

In such an embodiment, step S6 may further comprise forming a second via hole 15 in the first insulating layer 3, the second insulating layer 4 and the third insulating layer 8 at positions corresponding to the first transparent electrode line 14, as shown in FIG. 9. Step S7 may further comprise forming a second connection layer 16 in the second via hole 12 to electrically connect the first transparent electrode line 14 to the first transparent electrode 5, as shown in FIG. 10.

The formation processes employed in the above-described flow may include, for example, a film formation process such as deposition, sputtering, etc and a patterning process such as etching.

The technical solution of the present disclosure has been described above in detail with reference to the accompanying drawings. Currently, upon formation of an insulating layer, the conductive particles therein may cause a short circuit between the conductive structures on two sides of the insulating layer. According to the technical solution of the present disclosure, by disposing a first insulating layer and one or more second insulating layers, the data line can be spaced apart from the first transparent electrode by multiple insulating layers, and the data line would not be in conduction with the first transparent electrode in the event that conductive particles are present in one of the insulating layers. By disposing the second transparent electrode on the substrate, the first transparent electrode is spaced apart from the second transparent electrode at least by three insulating layers, and the first transparent electrode would not be in conduction with the second transparent electrode in the event that conductive particles are present in one or two insulating layers. Therefore, the technical solution of the present disclosure reduces the short circuit between the data line and the first transparent electrode layer, and between the first transparent electrode layer and the second transparent electrode layer.

It is to be noted that although only one second insulating layer and one third insulating layer are schematically illustrated in the drawings, those skilled in the art may set multiple second insulating layers and/or multiple third insulating layers in accordance with the teaching of the present disclosure. The materials and the thicknesses of the multiple second insulating layers may be the same or different, and the materials and the thicknesses of the multiple third insulating layers may be the same or different. When the display substrate comprises multiple second insulating layers or multiple third insulating layers, the short circuit between the data line and the first transparent electrode layer, and between the first transparent electrode layer and the second transparent electrode layer can be further reduced.

It is to be noted that, in the drawings, the dimensions of the layers and regions may be exaggerated for clarity of illustration. Moreover, it can be understood that when an element or layer is referred to as being "on" another element or layer, it may be directly on the other element or layer, or there may be an intermediate layer. In addition, it can be understood that when an element or layer is referred to as being "under" another element or layer, it may be directly under the other element or layer, or there may be more than one intermediate layers or elements. In addition, it can also be understood that when a layer or element is referred to as being "between" two layers or two elements, it may be a unique layer between the two layers or the two elements, or there may be more than one intermediate layers or elements. Similar reference numerals denote similar elements throughout.

In the present disclosure, the terms "first", "second", and "third" are for illustrative purposes only and cannot be construed as indicating or implying relative importance. The term "multiple" means two or more, unless otherwise expressly defined.

The foregoing embodiments are merely exemplary embodiments of the present disclosure and are not intended to limit the present disclosure. For those skilled in the art, various variations and modifications may be made to the present disclosure. Any modifications, equivalent substitutions, improvements, and the like made within the spirit and principle of the present disclosure should be encompassed within the scope of the present disclosure.

The invention claimed is:

1. A display substrate comprising:
   a substrate;
   a data line disposed over the substrate;
   a first insulating layer disposed on the data line;
   one or more second insulating layers disposed on the first insulating layer;
   a first transparent electrode disposed on the one or more second insulating layers;
   a gate and a second transparent electrode disposed on the substrate, the second transparent electrode corresponding to the first transparent electrode;
   one or more third insulating layers disposed on the gate and the second transparent electrode;
   an active layer disposed on a topmost one of the one or more third insulating layers; and
   a source and a drain disposed on the active layer,
   wherein
   in a region right above the data line, the first insulating layer directly contacts one of the one or more second insulating layer, and the one or more second insulating layer are configured to prevent conduction between the data line and the first transparent electrode,
   the data line is disposed on the topmost one of the one or more third insulating layers,
   the first insulating layer, the one or more second insulating layers, and the one or more third insulating layers are provided with a first via hole for communicating the second transparent electrode with the drain, and
   a first connection layer is provided in the first via hole for electrically connecting the second transparent electrode to the drain.

2. The display substrate according to claim 1, wherein the first insulating layer, the one or more second insulating layers, and the one or more third insulating layers are made of at least one of: a silicon-nitrogen compound, a silicon-oxygen compound.

3. The display substrate according to claim 1, wherein a portion of an upper surface of the drain is exposed in the first via hole, and
   the first connection layer is in contact with a side surface of the drain and the exposed portion of the upper surface of the drain, and a side surface of the second transparent electrode.

4. The display substrate according to claim 1, further comprising:
   a first transparent electrode line disposed on the substrate,
   wherein the first insulating layer, the one or more second insulating layers, and the one or more third insulating layers are provided with a second via hole at positions corresponding to the first transparent electrode line, and
   a second connection layer is provided in the second via hole for electrically connecting the first transparent electrode line to the first transparent electrode.

5. The display substrate according to claim 4, wherein a portion of the first connection layer, a portion of the second connection layer and the first transparent electrode are disposed in a same layer.

6. The display substrate according to claim 4, wherein the first transparent electrode line, the second transparent electrode, and the gate are disposed in a same layer.

7. The display substrate according to claim 1, wherein the data line, the source and the drain are disposed in a same layer.

8. The display substrate according to claim 1, wherein the first transparent electrode is a common electrode, and the second transparent electrode is a pixel electrode.

9. A display device comprising the display substrate according to claim 1.

10. The display device according to claim 9, wherein the first insulating layer, the one or more second insulating layers, and the one or more third insulating layers are made of at least one of: a silicon-nitrogen compound, a silicon-oxygen compound.

11. The display device according to claim 9, wherein a portion of an upper surface of the drain is exposed in the first via hole, and
    the first connection layer is in contact with a side surface of the drain and the exposed portion of the upper surface of the drain, and a side surface of the second transparent electrode.

12. A manufacturing method of a display substrate, comprising:
    forming a gate and a second transparent electrode on a substrate;
    forming a third insulating layer on the gate and the second transparent electrode;
    forming an active layer on the third insulating layer and forming a source, a drain, and a data line on the active layer;
    forming a first insulating layer on the source, the drain and the data line;
    forming a second insulating layer on the first insulating layer;
    forming a first transparent electrode on the second insulating layer; and
    forming, prior to forming the first transparent electrode, a first via hole in the first insulating layer, the second insulating layer and the third insulating layer for communicating the second transparent electrode with the drain, and forming a first connection layer in the first via hole to electrically connect the second transparent electrode to the drain, wherein in a region right above the data line, the first insulating layer directly contacts one of the one or more second insulating layer, and the one or more second insulating layer are configured to prevent conduction between the data line and the first transparent electrode.

13. The manufacturing method according to claim 12, wherein the step of forming the gate and the second transparent electrode on the substrate further comprises forming a first transparent electrode line on the substrate.

14. The manufacturing method according to claim 13, wherein the step of forming a first via hole in the first insulating layer, the second insulating layer and the third insulating layer for communicating the second transparent electrode with the drain, and forming a first connection layer in the first via hole to electrically connect the second transparent electrode to the drain further comprises:

forming a second via hole in the first insulating layer, the second insulating layer and the third insulating layer at positions corresponding to the first transparent electrode line, and forming a second connection layer in the second via hole to electrically connect the first transparent electrode line to the first transparent electrode.

15. The manufacturing method according to claim 12, wherein the first via hole is formed by dry etching.

* * * * *